United States Patent [19]

Gautier et al.

[11] 4,388,599

[45] Jun. 14, 1983

[54] PIEZOELECTRIC ELASTIC-WAVE CONVOLVER DEVICE

[75] Inventors: Herve Gautier; Charles Maerfeld, both of Paris, France

[73] Assignee: Thomson-CSF, Paris, France

[21] Appl. No.: 264,691

[22] Filed: May 18, 1981

[30] Foreign Application Priority Data

May 20, 1980 [FR] France .............................. 80 11225

[51] Int. Cl.$^3$ ........................ H01L 41/08; H03H 9/30

[52] U.S. Cl. .................................. 333/150; 333/153; 333/164; 333/161; 364/821

[58] Field of Search ................................ 333/150-155, 333/161, 193-196; 310/313 R, 313 A, 313 B, 313 C; 330/5.5; 364/821

[56] References Cited

PUBLICATIONS

Shreve et al., "Strip Coupled Acoustic Convolvers", IEEE Proceedings of the Ultrasonics Symposium, Monterey, New York, (US), Nov. 5-7, 1978, pp. 145-147.

Adkins, "Strip Coupled A2N and Si on Sapphire Convolvers", IEEE Proceedings of the Ultrasonics Symposium, Monterey, New York (US), Nov. 5-7, 1978, pp. 148-151.

Kino, "Acoustoelectric Interactions in Acoustic-Surface-Wave Devices", Proc. of the IEEE, vol. 64, No. 5, May 1976, pp. 724-748.

Ludvik et al, "Nonlinear Interaction of Acoustic Surface Waves in Epitaxial Gallium Arsenide", Electronics Letters, vol. 8, No. 22, Nov. 2, 1972, pp. 551-552.

*Primary Examiner*—Marvin L. Nussbaum
*Attorney, Agent, or Firm*—Cushman, Darby & Cushman

[57] ABSTRACT

A convolver based on the propagation of acoustic waves at the surface of a piezoelectric solid comprises a piezoelectric substrate, means for exciting two backward-traveling acoustic waves at the frequency f, means consisting of at least two electrodes for collecting the signal at the frequency 2f, the signal being produced as a result of nonlinear interaction of the two acoustic waves. The convolver device is connected to one of the two electrodes by means of a plurality of electrical contacts placed lengthwise and at intervals along the axis of propagation of the two interacting acoustic waves which are representative of the electrical signals applied to the two convolver inputs.

40 Claims, 17 Drawing Figures

FIG.14
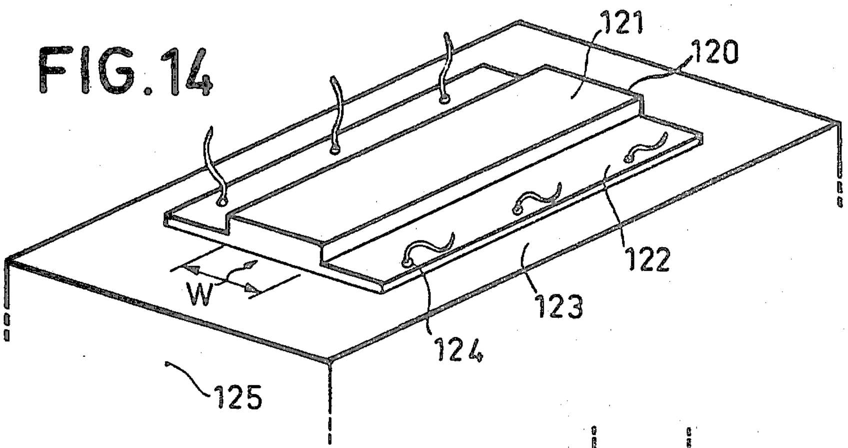
FIG.16
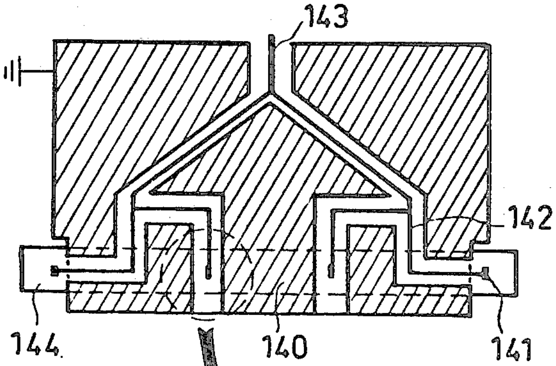
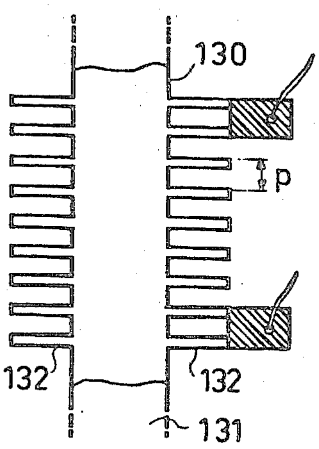
FIG.15
FIG.17
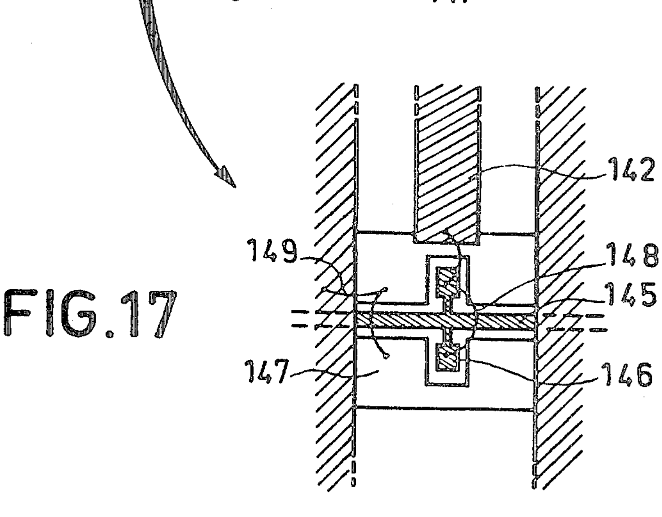

PIEZOELECTRIC ELASTIC-WAVE CONVOLVER DEVICE

This invention relates to convolvers based on the propagation of acoustic waves in piezoelectric solids. When two incident electrical signals having a timeduration T and a carrier frequency f are applied to a device of this type, backward-traveling elastic waves are excited at the ends of a substrate of piezoelectric material and propagate within a region of the surface of the substrate in which they interact nonlinearly in order to produce a double-frequency electric field. Said electric field is collected by an integrating electrode which covers the interaction region and said collecting electrode delivers an electrical signal, the modulation of which represents the convolution function of the two incident electrical signals. When the modulation function of one of the two incident signals has been subjected to a time reversal before being applied to one of the inputs of the convolver device, the emergent signal represents a correlation function. The invention is more particularly applicable to convolvers which are capable of processing signals by the analog technique, said signals being characterized by a f.T product having a high value.

Waveguide convolvers which have been constructed up to the present time have a response which tends to deviate from the mathematical expression of the convolution integral. In fact, when the length L of the collecting electrode becomes of substantial value in comparison with the electromagnetic wavelength, which corresponds to a f.T product of high value, it is necessary to take into account electromagnetic losses which cause disturbances at the level of the interaction. The signal arising from the interaction is no longer spatially uniform. Since the electric charges are no longer induced in phase, they are not added in equal phase within the interaction region. Furthermore, the resistance of the collecting electrode finally becomes appreciable with respect to the output impedance of the convolver, thus resulting in deterioration of the response. A further point which is worthy of mention is the fact that disturbances also appear at the level of the interaction, even if the length L of the collecting electrode is of small value in comparison with the electromagnetic wavelength when the product of resistance and capacitance of the waveguide is not of sufficiently low value with respect to the period 1/f.

In order to overcome the disadvantages set out in the foregoing, the aim of the invention is to collect the convolution signal by means of extractions which are made at successive points along the region of interaction of the backward-traveling elastic waves but which are in no way liable to interfere with the propagation of acoustic waves. The interval between two successive extraction points is chosen so as to ensure that the difference in uniformity of the interaction remains only slight when the collected signals are brought to the output of the convolver.

The invention is directed to a convolver device based on the propagation of acoustic waves at the surface of a piezoelectric solid and comprising:

a piezoelectric substrate;

means for exciting two backward-traveling acoustic waves at the frequency f;

means consisting of at least two electrodes for collecting the signal at the frequency 2f, said signal being produced as a result of the nonlinear interaction of the two acoustic waves.

The distinctive feature of the invention lies in the fact that the convolver device is connected to one of the two electrodes aforesaid by means of a plurality of electrical contacts placed lengthwise along the axis of propagation of the two acoustic waves.

Other features of the invention will be more apparent upon consideration of the following description and accompanying drawings, wherein:

FIG. 14 illustrates a convolver device having a shaped waveguide;

FIG. 15 shows an alternative embodiment of the device of FIG. 14;

FIG. 16 shows the connections between the contacts and the output of the convolver device;

FIG. 17 shows a detail of FIG. 16.

Figure 1:
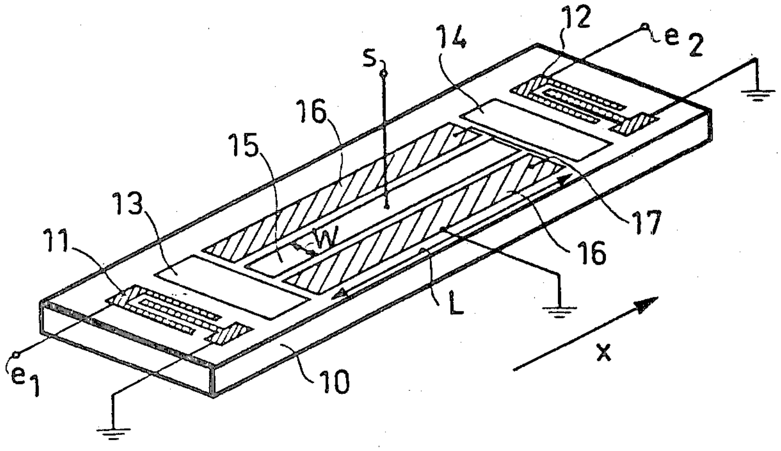
FIG. 1 illustrates a convolver device of known type.

FIG. 1 is a diagram showing a convolver of known type. There are placed on a substrate 10 of piezoelectric material and at the two ends of said substrate two transducers 11 and 12 in the form of interdigited electrodes which constitute the two convolver inputs $e_1$ and $e_2$. The two signals from which the convolution function is to be obtained are modulated about a center carrier frequency f equal to several tens of Megahertz. These two signals are applied to the inputs $e_1$ and $e_2$ in order to generate two backward-traveling elastic waves which propagate in two opposite directions at the surface of the substrate 10 with a greater or lesser degree of penetration according to the type of waves generated. The substrate 10 acts not only as a propagating medium but also as a nonlinear medium in which a nonlinear interaction of the two waves takes place and generates a double carrier frequency signal. Theoretically, this signal is spatially uniform in the interaction zone and is detectable by means of a uniform electrode 15 placed on the interaction zone.

Said electrode 15 forms a capacitance with a counter-electrode constituted for example by two lateral plates 16 connected to each other by means of a grounded lead 17. The plate 15 thus collects the electric charges induced by the nonlinear interaction of the two waves and delivers at its output s a signal C(t) at the frequency 2f.

If F(t) and G(t) are the two signals from which it is desired to obtain the convolution, the two backward waves emitted are of the form:

$$F\left(t - \frac{x}{v}\right) e^{j(\omega t - kx)} \text{ and } G\left(t + \frac{x}{v}\right) e^{j(\omega t + kx)}$$

where
x is the axis of propagation of the waves at the velocity v,
$\omega$ is the angular frequency $2\pi f$
k is the number of waves $\omega/v$.

There is obtained at the output s a signal:

$$C(t) = Ke^{2j\omega t} \int F(\tau) \cdot G(2t - \tau)dZ, \quad (1)$$

where K is related to the energy efficiency. The modulation of the signal C(t) represents the convolution function of the signals F(t) and G(t) which are compressed in time in a ratio of 2 and over a time interval corresponding to the period during which the two signals interact over the entire length L of the plate 15.

These devices are capable of processing signals of several tens of Megahertz having a bandwidth B and a time-duration T of a few tens of microseconds. They are of considerable interest on account of their great simplicity of construction, their high processing speed, their very small volume and very low power consumption.

The efficiency of devices of this type is higher as the width W of the interacting acoustic wave beams is smaller, in respect of a given power level of the input signal. In consequence, these devices are usually provided at the output of the transducers 11 and 12 with beam compressors represented schematically in FIG. 1 by the two rectangles 13 and 14. Said compressors can be constructed in different ways and in particular by means of conductive strips having a variable pitch or variable widths as described in the U.S. Pat. No. granted to C. Maerfeld 3,947,783: Furthermore, at the output of the compressors, the waves must be guided within said width W and this is achieved simply by making use of the plate 15. The guiding action is produced by slowing-down of the waves, this effect being caused by short-circuiting of the acoustic field at the surface. These devices accordingly make it possible to obtain a dynamic range of the order of 60 to 80 dB.

By way of non-limitative example, the device of FIG. 1 can be constructed as follows. The frequency f is equal to 156 MHz and the time-duration T is equal to 12 s. The beam compressors are provided by conductive-strip couplers. The electrodes 15 and 16 constitute a portion of electromagnetic transmission line in which the electromagnetic-wave propagation velocity $v_{EM}$ is low by reason of the high value of permittivity of the substrate. Propagation loss effects appear when the length L of the output plate is greater than approximately 0.1 of an electromagnetic wavelength $\lambda_{EM}$ which is equal to $v_{EM}/2f$. These effects not only introduce phase shifts between the charge sources and the contact points but also introduce reflections at the points of electrical discontinuity.

The condition $L/\lambda_{EM} > 0.1$ corresponds to:

$$\frac{2v_a}{v_{EM}} \cdot fT > 0.1 \quad (3)$$

where $v_a$ is the acoustic wave velocity.

The device herein described has a midband frequency equal to 156 MHz in respect of a 50-MHz band. It should be added that typical values are $v_a = 3500$ m/s and $v_{EM} = 4.3 \times 10^8$m/s in the case in which the piezoelectric material employed is $LiNbO_3$. With these values, the inequality (3) makes it necessary to take the propagation effects into account when fT becomes higher than 600.

By reason of the propagation effects, the signal obtained at the output s is:

$$H(t) = Ke^{2j\omega t} \int M(\tau) \cdot F(\tau) \cdot G(2t - \tau)d\tau \quad (2)$$

In this expression, the factor $M(\tau)$ which is a function of $\tau$ arises from nonuniformity of the interaction and the signal H(t) no longer represents the convolution function of the two signals F(t) and G(t).

The resultant disadvantage is therefore very considerable, especially as it is practically impossible to correct the term $M(\tau)$ a posteriori.

Figure 2:
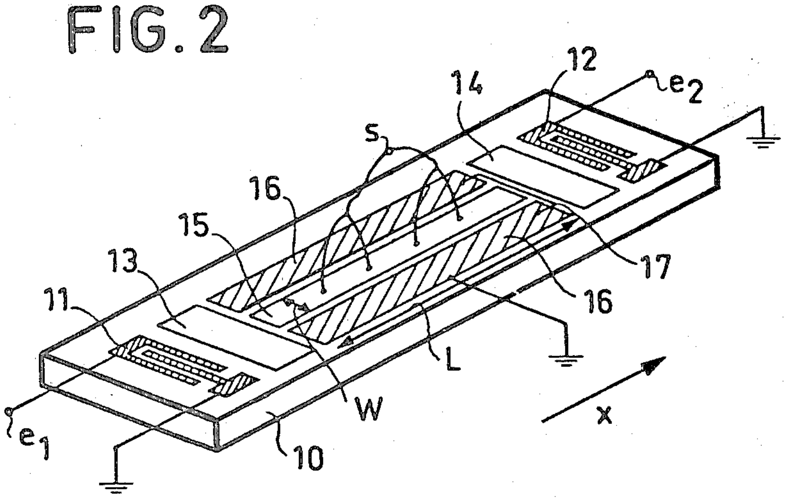
FIG. 2 illustrates a convolver device according to the invention.

The convolver device according to the invention as illustrated in FIG. 2 comprises an output electrode 15 provided with a plurality of contacts located at uniform intervals over its entire length along the axis of propagation of the acoustic waves and connected to each other so as to form the output s of the convolver, the maximum interval between contacts being chosen so as to obtain a low error of uniformity of the interaction.

Figure 3:
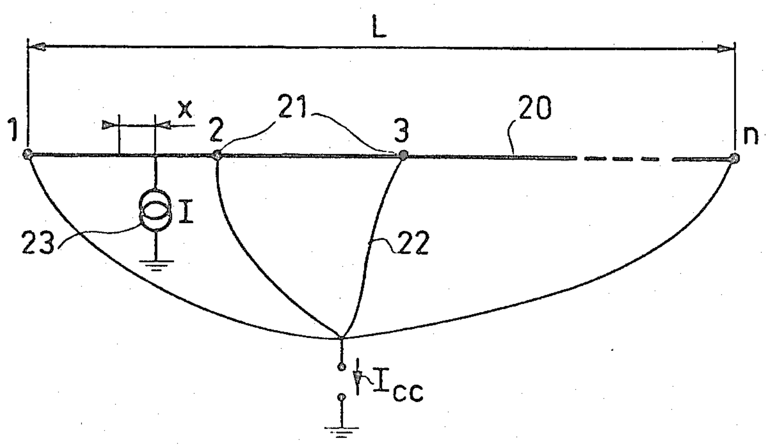
FIG. 3 is an explanatory diagram.

The maximum interval between contacts or contact connections can be evaluated by calculation. In order to make this calculation, the output plate 15 is assimilated with a lossy electromagnetic transmission line, the propagation constant being of the form $\gamma = (-a + 2j\pi)/\lambda_{EM}$, where a is the attenuation per wavelength in the line (in nepers). Referring to FIG. 3, the transmission line 20 is provided with n equidistant contacts 21 connected to each other at a common point or node by means of leads 22 which introduce a negligible phase displacement. The short-circuit current $I_{cc}$ is then determined at the output as a function of the abscissa of an acoustic generator 23 having a load I, the abscissa x being determined with respect to the center of the interval between two contact connections such as, for example, the connections 1 and 2.

Figure 4:
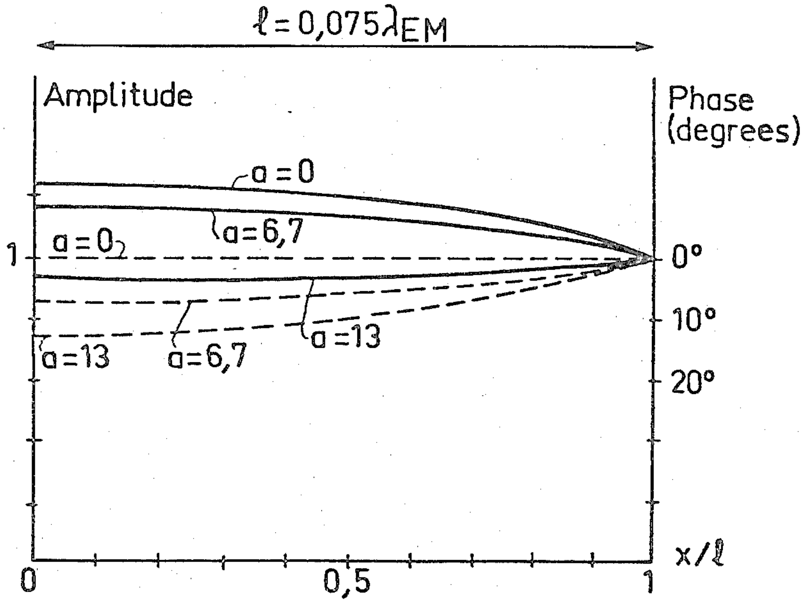
FIG. 4 is a graphical representation.

FIG. 4 shows the variations of $I_{cc}/I$ in amplitude (full line) and in phase (dashed line) in the case in which the half-distance between contact connections $L = L/2$ $(n-1)$ is equal to $0.075\ \lambda_{EM}$, in respect of three values of attenuation a per $\lambda_{EM}$ in nepers. This attenuation a is such that $a = RCf$ if R and C are the resistance and the capacitance in respect of one $\lambda_{EM}/W$ of the waveguide. The resistance R is given by $r\lambda_{EM}/W$ if r is the plate resistivity; the capacitance C is dependent on the distance between the positive and negative electrodes and is adjustable.

In the case of values of W, L, r and C, the loss a is known and the maximum spacing between contact connections can be determined in order to obtain the requisite uniformity error.

In practice, the value of a seldom exceeds 6 nepers. Referring to FIG. 4, the maximum distance between contact connections is of the order of $0.1\ \lambda_a$ to $0.2\ \lambda_a$ in respect of a phase and amplitude error which is limited respectively to 10° and 1 dB.

The contacts on the output plate must be so arranged as to ensure that they do not interfere with propagation of the acoustic waves. The high operating frequencies being taken into consideration, the dimensions are very small since the plate can have a width of only a few tens of microns and a number of different fabrication techniques are open to choice.

Figure 5:
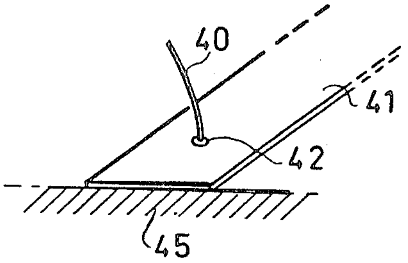
FIGS. 5 and 6 illustrate a first alternative form of construction of the contact connections.
Figure 6:
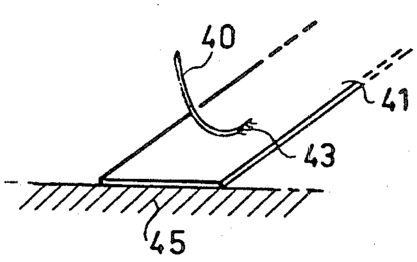

As shown in FIGS. 5 and 6, the contacts are formed by direct welding or bonding of a conducting wire 40 to the output plate 41 which is placed on the surface of the substrate 45. In order to prevent diffraction effects and to limit the mechanical load, the dimensions of the weld spot connection 42 or of the bonding spot connection 43 do not exceed one-tenth of the acoustic wavelength.

Welding is effected either by thermocompression or by ultrasonic vibrations. Bonding on the other hand is obtained in the cold state by employing either indium or electrically conductive epoxy resin.

The contacts can be formed by welding or bonding next to the plate in order to permit an increase in size of the weld spot connection or of the bonding spot connection. To this end, the contacts are formed at a distance from the plate such that the energy of the acoustic waves is practically zero, this distance being of the order of a few wavelengths.

Figure 7:
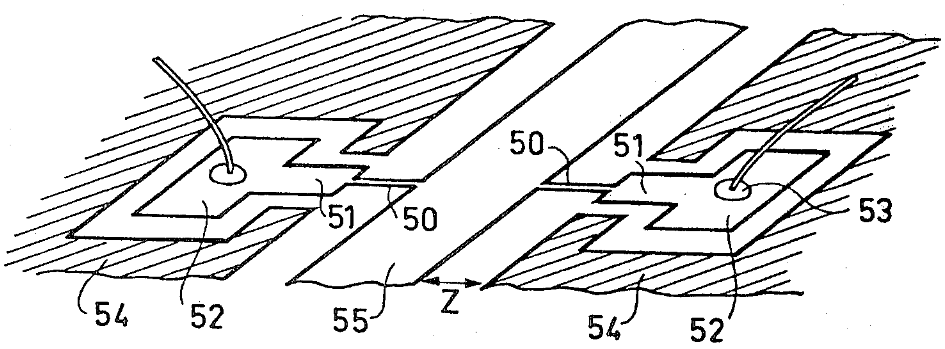
FIG. 7 illustrates a second alternative form of construction of a contact connection.

One example of construction is shown in FIG. 7 in the case of the three-plate convolver of FIG. 2. A number of connection chips 52 are disposed along the plate 55 at the surface of the substrate. Said chips are connected electrically to the plate by means of conductive strips 50, the width of which is smaller than $\lambda_a/5$ in order to ensure minimum interference with the propagation of acoustic waves, the length of said chips being equal to Z and chosen so as to locate these latter at a sufficient distance from the plate. Said conductive strips are joined to the chips by means of strips 51 of greater width in order to reduce the electrical resistance. Referring to FIG. 7, the ground electrodes 54 are recessed in order to accommodate the chips 52 but this discontinuity does not affect the uniformity of the interaction. The electrodes 54 can also be placed at a sufficient distance from the plate to remain uniform if this is permitted by the width of the substrate. Said electrodes can also be placed on the bottom surface of the substrate. The welding or bonding spot connections 53 can be formed on the chips by means of any conventional technique since there is no longer any restriction arising from dimensional considerations.

When adopting this technique, it is found that an acoustoelectric coupling exists between the metallic surfaces and the substrate, thus producing parasitic effects such as, in particular, an increased loss of sensitivity at the level of the connections.

Figure 8:
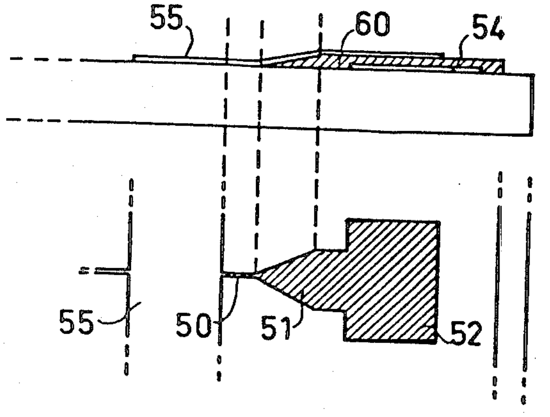
FIG. 8 illustrates a third alternative form of construction of a contact connection.

As shown in FIG. 8, each metallic strip 51 and each connection chip 52 are placed on a thin film of electrically insulating material 60 such as resin or $SiO_2$, thus appreciably reducing the coupling between the substrate and the metallized portions. This technique makes it possible to provide chips having large dimensions and electrodes of uniform mass which may be placed opposite to the chips if necessary.

Figure 9:
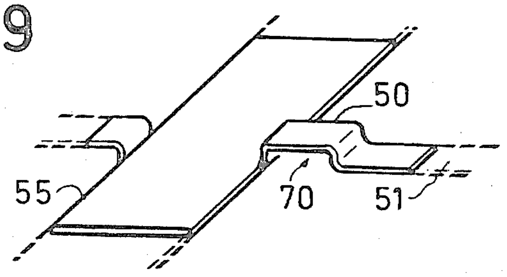
FIG. 9 illustrates a fourth alternative form of construction of a contact connection.

In FIG. 9, there is shown another technique which makes it possible to dispense with coupling by the conductive connecting strips 50. Each strip is metallized on a material which is subsequently removed so as to leave an air gap 70 between substrate and strip. It is worthy of note that this technique is already known in particular in the field of fabrication of acoustic filters.

In these forms of construction, the waveguide 55, the strips 50 and 51 and the chips 52 are metallized for example by deposition, evaporation or sputtering by means of a mask formed by means of the photolithographic technique.

Another mode of construction consists in placing an electrode in the form of a plate and similar to the waveguide in a position opposite to this latter. The connections to the output circuit are made on said electrode.

Figure 10:
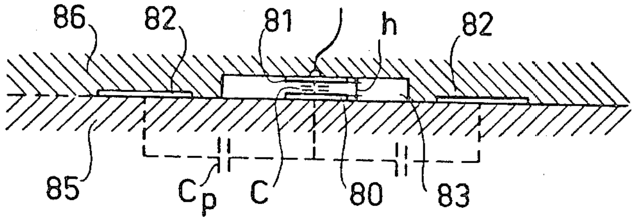
FIG. 10 shows a capacitive coupling mode.

FIG. 10 is a sectional view showing a construction based on capacitive coupling. The devices for generating acoustic waves and the waveguide 80 are placed at the surface of a first substrate 85 which can also be provided with the ground electrodes 82. A second substrate 86 is applied to the surface of the first substrate 85. In order to circumvent problems arising from thermal stresses, both substrates are preferably made of the same material. The substrate 86 is provided with a cavity 83 fitted with an output electrode 81 which is placed opposite to the waveguide 80 at a predetermined distance h. Said distance h is chosen so as to provide a capacitive coupling between the electrode and the waveguide without reducing the efficiency of the convolver. To this end, the adjusted capacitance C must be of substantial value in comparison with the capacitance $C_p$ of the piezoelectric substrate. In the case of a device as shown in FIG. 2, the value of the capacitance $C_p$ is of the same order as the permittivity $\epsilon_p$ of the substrate whilst the value of the capacitance C is equal to $\epsilon_o W/h$, where $\epsilon_o$ is the permittivity of the air, these values being counted per unit of length along the axis of wave propagation. The condition $C >> C_p$ is therefore written $h << W/\epsilon_p/\epsilon_p$. For example, $W = 50\mu$ and $\epsilon_p/\epsilon_o = 50$, with the result that $h >> 1\mu$ and h will be of the order of 1000 Å.

In an alternative form of construction, the substrate 85 will be provided with the cavity such as 83 which is fitted with the acoustic wave guide 80 whilst the other substrate is flat.

Figure 11:
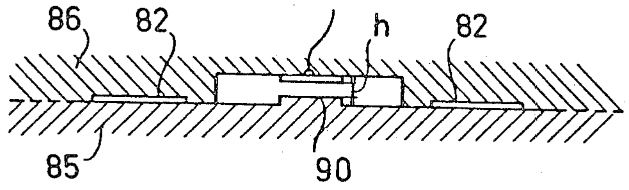
FIGS. 11 and 12 show alternative forms of the coupling mode illustrated in FIG. 10.
Figure 12:
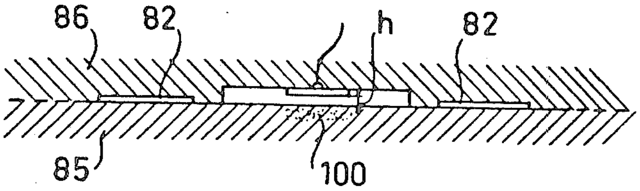

FIGS. 11 and 12 show two further alternative forms of construction in which the waveguide is not metallized. Thus said guide is formed either by shaping the substrate so as to give this latter a greater thickness opposite to the output electrode as shown at 90 in FIG. 11 or by modifying the structure of the substrate opposite to the output electrode by ion implantation as shown at 100 in FIG. 12.

In these forms of construction, the faces of the two piezoelectric substrates 85 and 86 are polished and brought into contact with each other, then held in position by bonding or mechanically by pressing or alternatively by adhesion as obtained by means of an optical joint.

Figure 13:
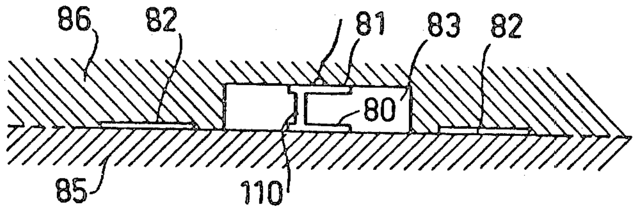
FIG. 13 shows a mode of direct-current coupling by means of contact-studs.

FIG. 13 shows a construction in which metallic studs 110 are formed between the metallic waveguide and the output electrode. In this embodiment, the height of the cavity 83 can be appreciably greater than in the capacitive-coupling embodiments and is therefore less critical. In order to avoid any interference with propagation of the acoustic waves, the lateral dimension of each stud is small in comparison with $\lambda_a$ and is approximately 0.1 $\lambda_a$; moreover, said studs 110 are distributed along the waveguide in a random manner in order to prevent cumulative effects, the mean distance between studs being of the order of 100 $\lambda_a$.

Formation of the studs is carried out beforehand, either on the waveguide 80 or on the electrode 81 by means of the photoetching process, for example, the two substrates being then assembled together in accordance with one of the techniques mentioned earlier.

A shaped-guide construction is shown in FIG. 14. The guide 120 is shaped in thickness transversely to the wave propagation axis in order to have a central zone 121 and two lateral zones 122. The central zone has a greater thickness than the two lateral zones so that a mechanical load effect is produced on the substrate 125, thus resulting in a lower propagation velocity beneath said central zone and consequently in a wave-guiding action. Furthermore, the velocity within the free zone of the substrate 123 is higher than that of the lateral zones by reason of an electrical short-circuit effect at the surface of the substrate. The lateral zones 122 are formed in such a manner as to have high electrical conduction.

Shaping of the waveguide is achieved by ion machining, for example. The waveguide can also be shaped by overlaying a conductive or insulating material on a metallization layer which has been deposited beforehand.

The electrical contacts 124 are formed at the level of the outer edges of the lateral zones outside the zone in which the acoustic energy is present.

A form of construction consisting of a waveguide of uniform thickness is shown in the overhead view of FIG. 15. The guide 130 of uniform thickness has a structure which is transverse to the axis of wave propagation with a view to forming a central guiding zone 131 and two lateral zones on which the electrical connections are made. The central zone is continuous whilst the two lateral zones are non-continuous and formed by cutting the guide into strips (132) at right angles to its axis. The central zone thus establishes a total short-circuit at the surface of the substrate, thus slowing-down the waves relative to the lateral zones which form a partial short-circuit.

There are thus obtained two zones having different metallization densities. The spacing p between strips (132) is chosen so as to be smaller than $\lambda_a/2$ in order to prevent the well-known "stop band" effects and thus to maintain a large bandwidth B.

This form of construction is easier to carry into practice than the previous embodiment. For example, the waveguide is obtained by photoetching or photolithography. The electrical contacts are formed at the ends of the strips.

In the case of the two last-mentioned types of construction, the electrical contacts can be formed at the edges of the lateral zones:

either by welding or bonding directly;

or by metallization of studs with or without insulating material.

It may be mentioned by way of example but without any limitation being implied that, in the case of a convolver which has actually been constructed, the characteristics of the convolver were as follows: f=300 MHz and T=10 μs. The waveguide had a width W of 30μ and a length L of 35 mm. Provision was made for four equidistant contact connections located at intervals of l, two of which were located at the ends, with the result that the ratio $l/\lambda_{EM}$ was in the vicinity of 0.16, the frequency band being equal to 100 MHz.

FIGS. 16 and 17 are schematic diagrams showing the assembly consisting of convolver and output circuit. In FIG. 16, there are shown the four output connections 141 which are placed on the substrate 144. The output circuit 140 is added in the vicinity of said substrate and consists, for example, of a printed circuit having a thickness of a few tenths of a millimeter.

FIG. 17 is a detail view which serves to show the connections at the level of a terminal. The metallized studs 146 are connected to the waveguide 145 and connected to each other at the ends of the tracks 142 of the output circuit by means of gold wires 148 having a length of a few millimeters. Similarly, the ground electrodes 147 are connected to those portions of the output circuit which are connected to ground at 149.

The arrangement of the tracks 142 makes it possible to connect the four terminals to the output cable 143 having an impedance which is usually equal to 50 Ω by means of leads having identical lengths, thus permitting phase summation of the signals delivered by the terminals. It should be noted that this form of construction is made possible by the fact that the velocity of the electromagnetic waves within the guide is low in comparison with the wave velocity of the conventional transmission lines constituted by the tracks 142. The output circuit can also be formed on the acoustic substrate which has previously been metallized and covered with an insulating layer having a permittivity which is as low as possible.

In conjunction with a suitably chosen spacing between contacts, a construction of this type makes it possible to obtain a uniformity of amplitude response below 1 dB and a phase uniformity below 15°. With only the two end terminals connected together, the result is an amplitude uniformity to within 5 dB and a phase uniformity within the range of 80 to 90 degrees.

What is claimed is:

1. A convolver device based on the propagation of acoustic waves at the surface of a piezoelectric solid and comprising:

a piezoelectric substrate, means for exciting two backward-traveling acoustic waves at the frequency f, means consisting of at least two electrodes for collecting the signal at the frequency 2f, said signal being produced as a result of the nonlinear interaction of the two acoustic waves, wherein the output of said device is connected to one of said electrodes by means of a plurality of electrical contacts placed lengthwise along the axis of propagation of the two acoustic waves.

2. A convolver device according to claim 1, wherein said device comprises means for spatial compression of the two acoustic waves and wherein the electrode connected to the output forms a waveguide.

3. A convolver device according to claim 2, wherein the spacing between the contacts is chosen so as to have a small value in comparison with the electromagnetic wavelength $\lambda_{EM}$ equal to $v_{EM}/2f$ where $v_{EM}$ is the velocity of the electromagnetic waves within the guide.

4. A convolver device according to claim 2, wherein the spacing between the contacts is chosen so as to ensure that the product of resistance and capacitance of the waveguide portions between two contacts is of sufficiently low value in comparison with the period 1/s.

5. A convolver device according to claim 2, wherein the electrode connected to the output is a metallization layer deposited on the surface of the substrate.

6. A convolver device according to claim 5, wherein the electrical contacts are formed directly on the waveguide by welding or by bonding, the dimension of the weld spot or bonding spot connection being smaller than 0.1 times the acoustic wavelength $\lambda_a$ equal to $v_a/2f$, where $v_a$ is the velocity of the acoustic waves.

7. A convolver device according to claim 6, wherein the weld spot connection is obtained by thermocompression.

8. A convolver device according to claim 6, wherein the weld spot connection is obtained by ultrasonic vibrations.

9. A convolver device according to claim 6, wherein the bonding operation is carried out with indium or with conductive epoxy resin.

10. A convolver device according to claim 5, wherein the electrical contacts extend laterally with respect to the waveguide.

11. A convolver device according to claim 10, wherein metallic chips extending alongside the waveguide are deposited in recesses in order to receive the electrical contacts and are joined to the waveguide by means of first metallic strips, the width of said first strips being smaller than $\lambda_a/5$.

12. A convolver device according to claim 11, wherein the connection chips are joined to the first strips by means of strips which increase in width at a distance from the waveguide.

13. A convolver device according to claim 12, wherein said device comprises a thin film of insulating material between the surface of the piezoelectric substrate and the assembly consisting of widened strips and connection chips.

14. A convolver device according to claim 1, wherein said device comprises two ground electrodes deposited at the surface of the substrate on each side of the waveguide.

15. A convolver device according to claim 11, wherein each electrical contact is associated with two connection chips placed on each side of the waveguide.

16. A convolver device according to claim 11, wherein said device comprises ground electrodes deposited on the surface of the substrate, said ground electrodes being recessed around each connection chip.

17. A convolver device according to claim 11, wherein the first strips are deposited on the surface of the substrate.

18. A convolver device according to claim 11, wherein the first strips are in the form of stirrup-pieces whose ends rest on the surface of the substrate.

19. A convolver device according to claim 10, wherein the contacts are formed by one of the following means: welding by thermocompression, welding by ultrasonic vibrations, bonding with indium and bonding with electrically conductive epoxy resin.

20. A convolver device according to claim 2, wherein the dimensions of the electrode which is connected to the output are similar to those of the waveguide, said electrode being located at a predetermined distance above said waveguide.

21. A convolver device according to claim 20, wherein said device comprises a second substrate applied to the surface of the first substrate which supports the waveguide and wherein a recess is formed in said second substrate and fitted with the electrode which is connected to the output.

22. A convolver device according to claim 21, wherein the depth of the recess is chosen so as to ensure that the distance h between the waveguide and the electrode which is connected to the output is considerably smaller than $W/\epsilon_p$, where W is the width of the waveguide and $\epsilon_p$ is the relative permittivity of the substrate, and permits a capacitive coupling between said waveguide and said output-connected electrode without impairing the efficiency of the convolver.

23. A convolver device according to claim 21, wherein the contact faces of the first and second substrate are polished and then held together either by bonding or by mechanical pressing or by adhesion obtained by means of an optical joint.

24. A device according to claim 20, wherein a recess is formed in the first substrate and fitted with the waveguide, a second substrate being applied to the surface of the first substrate.

25. A convolver device according to claim 21, wherein the acoustic wave guide is formed by depositing a metallization layer on the surface of the first substrate over the width W.

26. A convolver device according to claim 21, wherein the waveguide is formed by means of an overthickness of the first substrate having a width W.

27. A convolver device according to claim 21, wherein the waveguide is formed by modifying the structure of the surface of the first substrate over the width W by ion implantation.

28. A convolver device according to claim 5, wherein the waveguide is shaped in thickness transversely to the axis of propagation of the acoustic waves so as to have a central zone of greater thickness having a width W and at least one lateral zone of smaller thickness, the electrical contacts being formed at the level of the outer edges of the lateral zone or zones.

29. A convolver device according to claim 28, wherein shaping of the waveguide is performed by overlaying a material having a width W on a metallization layer previously formed.

30. A convolver device according to claim 28, wherein shaping of the waveguide is performed by machining the metallization layer.

31. A convolver device according to claim 28, wherein the waveguide is shaped so as to have two lateral zones having the same width on each side of the central zone.

32. A convolver device according to claim 5, wherein the waveguide is formed of a full central zone having a width W for guiding the waves and of at least one recessed lateral zone having the same thickness and constituted by strips extending away from the axis of the waveguide, the electrical contacts being formed at the ends of said strips.

33. A convolver device according to claim 32, wherein the relative spacing of the strips does not exceed $\lambda_a/2$.

34. A convolver device according to claim 32, wherein said device comprises a lateral zone on each side of the central zone.

35. A convolver device according to claim 28, wherein the electrical contacts are formed by one of the following means: welding by thermocompression, welding by ultrasonic vibrations, bonding with indium and bonding by means of electrically conductive epoxy resin.

36. A convolver device according to claim 28, wherein the electrical contacts consist of chips formed by metallization at the surface of the substrate.

37. A device according to claim 28, wherein the metallized chips are separated from the surface of the substrate by a thin film of insulating material.

38. A convolver device according to claim 5, wherein metallization is obtained as a result of deposition performed by evaporation of the metal.

39. A convolver device according to claim 5, wherein metallization is obtained as a result of deposition performed by sputtering of the metal.

40. A device according to claim 2, wherein the electrical contacts are connected to the output by means of tracks of equal length of a printed circuit placed in proximity to the substrate.

* * * * *